US008400865B2

(12) United States Patent
Romanovsky (10) Patent No.: US 8,400,865 B2
(45) Date of Patent: Mar. 19, 2013

(54) MEMORY MACRO CONFIGURATION AND METHOD

(75) Inventor: Sergey Romanovsky, Ottawa (CA)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 377 days.

(21) Appl. No.: 12/877,147

(22) Filed: Sep. 8, 2010

(65) Prior Publication Data

US 2012/0057412 A1   Mar. 8, 2012

(51) Int. Cl.
*G11C 8/00* (2006.01)

(52) U.S. Cl. ......... 365/230.05; 365/189.05; 365/189.08; 365/230.06

(58) Field of Classification Search ............. 365/189.05, 365/189.08, 230.05, 230.06; 711/104, 102, 711/101, 105
See application file for complete search history.

(56) References Cited

U.S. PATENT DOCUMENTS

| | | | |
|---|---|---|---|
| 6,467,017 B1 | 10/2002 | Ngai et al. | |
| 6,578,104 B1 | 6/2003 | Small et al. | |
| 6,928,377 B2 | 8/2005 | Eustis et al. | |
| 7,113,443 B2 * | 9/2006 | Dhong et al. | 365/230.03 |
| 7,295,480 B2 | 11/2007 | McPartland | |
| 7,688,658 B2 * | 3/2010 | Yamada | 365/201 |

OTHER PUBLICATIONS

Kook, J. et al., "A Low Power Reconfigurable I/O DRAM Macro with Single Bit line Writing Scheme", Solid State Circuits Conference, Sep. 19-21, 2000, ESSCIRC '00. Proceedings of the 26th European, pp. 192-195.

* cited by examiner

*Primary Examiner* — Richard Elms
*Assistant Examiner* — Hien Nguyen
(74) *Attorney, Agent, or Firm* — Duane Morris LLP; Steven E. Koffs (57) ABSTRACT

A memory macro comprises a plurality of memory array segments, each having a predetermined number of data inputs and outputs. A segment decoder circuit is configured to: receive a first value indicating a number of memory partitions among which the memory array segments are to be divided, and output a plurality of signals for selectively activating one or more of the plurality of memory array segments to be accessed based on the first value. A plurality of output drivers are coupled to the segment decoder circuit and to respective ones of the outputs. The plurality of output drivers are configured to selectively output data from the respective outputs of each of the respective activated memory array segments.

20 Claims, 12 Drawing Sheets

Truth Table

| SEGMENT[7:0]@FLEXIO[1:0]=00 | SEGMENT[7:0]@FLEXIO[1:0]=01 | SEGMENT[7:0]@FLEXIO[1:0]=10 | SEGMENT[7:0]@FLEXIO[1:0]=11 |
|---|---|---|---|
| 00000001, when A[15:13]=000 | 00010001, when A[14:13]=00 | 01010101, when A[13]=0 | 11111111 |
| 00000010, when A[15:13]=001 | 00100010, when A[14:13]=01 | 10101010, when A[13]=1 | |
| 00000100, when A[15:13]=010 | 01000100, when A[14:13]=10 | | |
| 00001000, when A[15:13]=011 | 10001000, when A[14:13]=11 | | |
| 00010000, when A[15:13]=100 | | | |
| 00100000, when A[15:13]=101 | | | |
| 01000000, when A[15:13]=110 | | | |
| 10000000, when A[15:13]=111 | | | |

MEMORY MACRO CONFIGURATION AND METHOD

FIELD

The present disclosure relates to semiconductor structures and methods generally, and more specifically to memory macros.

BACKGROUND

Many integrated circuits (such as application specific integrated circuits, also called ASIC) include an embedded dynamic random access memory (eDRAM) block (also referred to as an eDRAM macro). By embedding the DRAM on the integrated circuit (IC) chip with a digital signal processor (DSP) or other special purpose hardware, the chip designer avoids large latency between the DSP or hardware and a separate memory chip. Compared to using a separate DRAM chip, eDRAM offers increased data bandwidth and reduced power consumption. The use of dDRAM also permits reduction in the overall footprint of products. Thus, eDRAM is increasingly popular in a large variety of electronic devices, including but not limited to cellular phones, smart phones, MP3 players, and portable laptops.

The ASIC environment in which the eDRAM is included may have a variety of system buses, and a variety of bus bandwidths. In designing a product, the IC designer will seek to match the bandwidth of the eDRAM (the number of input output pins, or I/Os) to the bandwidth of the system bus. One approach to generate different product configurations with different eDRAM macro bandwidths is a software solution using a compiler. However, this usually entails providing multiple eDRAM configurations corresponding to the different desired bandwidths and, therefore, has a high cost.

Another method to vary the number of I/Os for an eDRAM macro is to include a plurality of macros by abutment. For example, to double the bandwidth of a given macro, two memory macros may be included, instead of one. This approach grows the physical size of the memory when a wider data bus is required. This doubles the area devoted to the eDRAM macro.

DETAILED DESCRIPTION

This description of the exemplary embodiments is intended to be read in connection with the accompanying drawings, which are to be considered part of the entire written description.

Figure 1A:
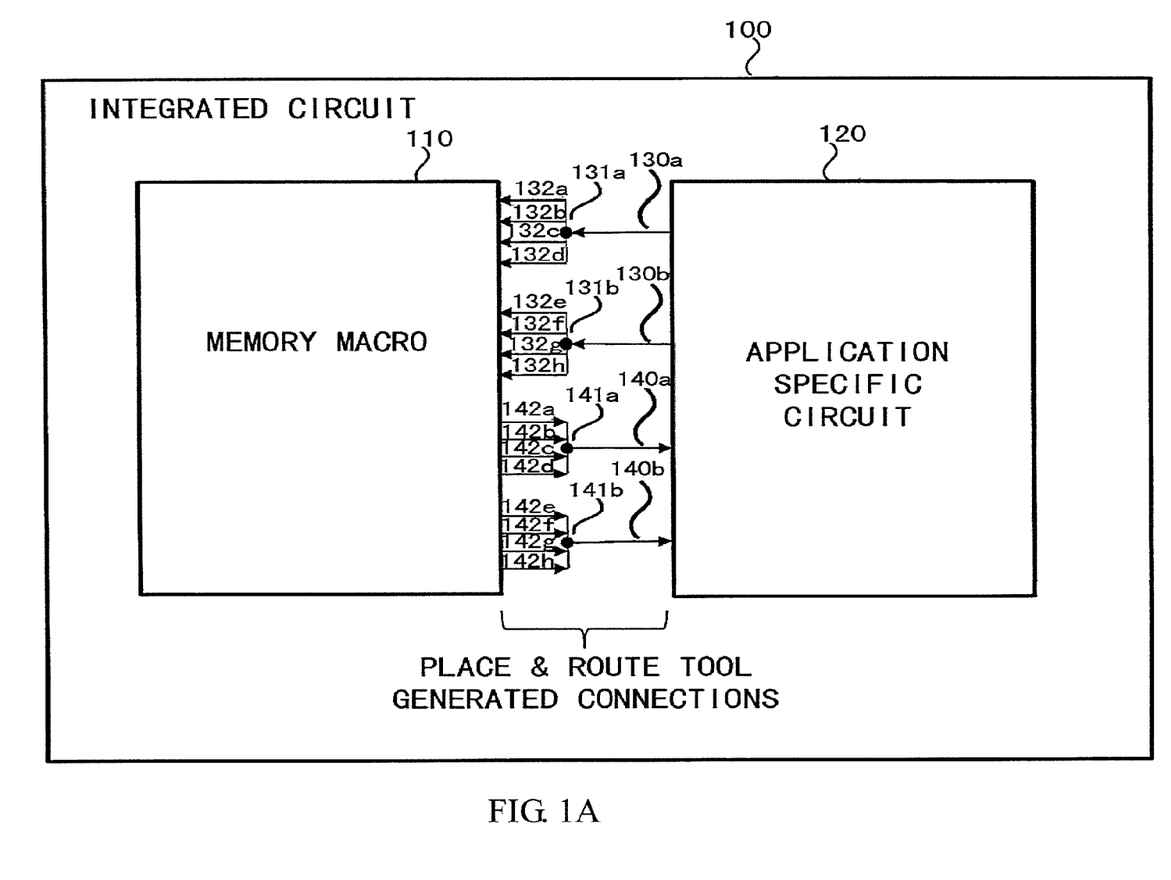
FIGS. 1A and 1B are block diagrams of an application specific integrated circuit including an eDRAM macro.

FIG. 1A is a block diagram of an integrated circuit (IC) 100 including an eDRAM macro 110 and an application specific circuit 120. The eDRAM macro 110 has a reusable design, which can be included in a variety of ICs. In some embodiments, eDRAM macro 110 is designed by a semiconductor foundry, and circuit 120 is designed by a fabless design house (a semiconductor vendor that does not have in-house manufacturing facilities). In other embodiments, both eDRAM 110 and circuit 120 are designed by an integrated design manufacturer.

The application specific circuit block 120 is configured for performing at least one arithmetic or logical operation on data to be retrieved from or stored in the eDRAM macro 110. Circuit 120 may include any combination of special purpose functions and reusable IP cells, separate from the memory macro 110.

A macro and method are described which allows the designer of circuit 120 to change the macro configuration by external connections. For example, an original memory macro size is M words×N I/Os, or M×N. Without changing the size (M×N) of the macro 110, the macro can be configured as (M×K) words×(N/K) I/Os, where K is integer, and N/K is a number of partitions. Examples of values for K include, but are not limited to 2, 4, 8, 16, etc. and a series of corresponding example macro configurations include:

M words×N I/Os,
(M×2) words×(N/2) I/Os,
(M×4) words×(N/4) I/Os,
(M×8) words×(N/8) I/Os,
(M×16) words×(N/16) I/Os, etc.

The eDRAM macro 110 has a plurality of flexible I/O pins 132a-132h and 142a-142h, which can be reconfigured by forming connections 131a, 131b, 141a, 141b between pins, external to the macro 110. This reconfiguration can be accomplished in an automated place and route (APR) tool, without affecting the internal design of the macro 110. Because the APR tool would be used to connect the application specific circuit 120 to the macro 110 regardless of how the macro I/O pin configuration is to be configured, forming the hard-wired connections in the APR tool does not increase the complexity of the design or the fabrication process.

In the example of FIG. 1A, eight input pins 132a-132h and eight output pins 142a-142h are shown for brevity, but any number of I/Os (e.g., 256, 288, 512, or the like) may be used. In FIG. 1A, the application specific circuit 120 has only two inputs 140a, 140b and two outputs 130a, 130b. In this simplified example, the APR tool forms circuit segments connecting the circuit output 130a to the four macro inputs 132a-132d at a common node 131a. Similarly, the APR tool forms: (1) circuit segments connecting the circuit output 130b to the four macro inputs 132e-132h at a common node 131b; (2) circuit segments connecting the circuit input 140a to the four macro outputs 142a-142d at a common node 141a; and (3) circuit segments connecting the circuit input 140b to the four macro outputs 142e-142h at a common node 141b.

The same eDRAM macro 110 can be reused with an application specific circuit having four input pins and four output pins, or an application specific circuit having other numbers of I/Os.

Figure 1B:
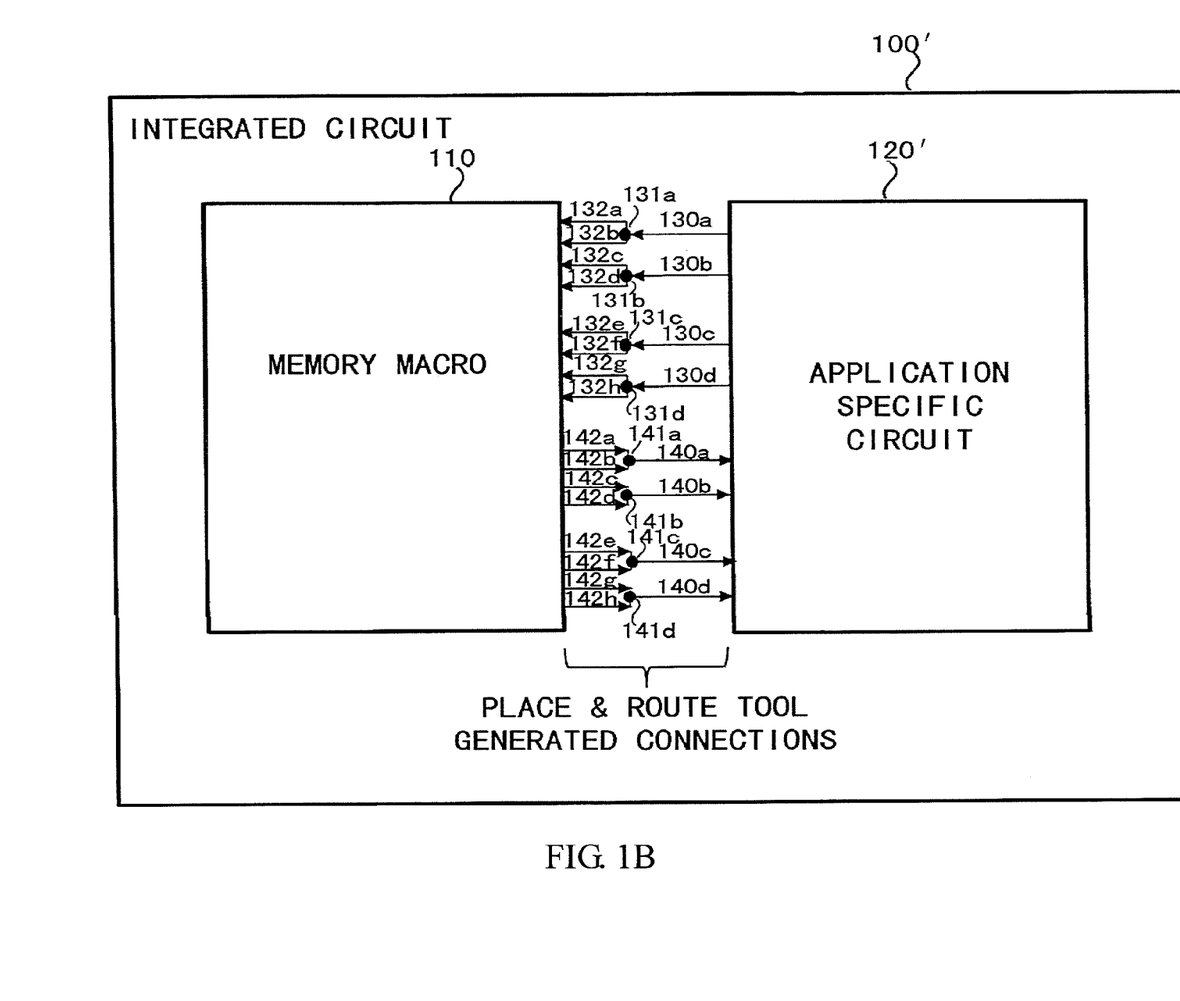

For example, as shown in FIG. 1B, the same eDRAM macro 110 is connected to a different application specific circuit 120' having four I/Os (outputs 130a-130d and inputs 140a-140d. Without making any changes inside of macro 110, the connections made by the place and route tool are used to "reconfigure" the I/Os of macro 110. Thus, APR tool generates circuit segments to connect:

(1) output 130a to input pins 132a, 132b at a common node 131a;

(2) output 130b to input pins 132c, 132d at a common node 131b;

(3) output 130c to input pins 132e, 132f at a common node 131c;

(4) output 130d to input pins 132g, 132h at a common node 131d;

(5) input 140a to output pins 142a, 142b at a common node 141a;

(6) input 140b to output pins 142c, 142d at a common node 141b;

(7) input 140c to output pins 142e, 142f at a common node 141c; and (8) input 140d to output pins 142g, 142h at a common node 141d.

Although not shown in FIGS. 1A and 1B, the same macro 110 can also be reused with an application specific circuit configured for 8 I/Os, by making one-to-one connections between the I/O pins of the macro 110 and the I/O pins of the application specific circuit in the APR tool.

In some embodiments, the eDRAM macro 110 has a segmented I/O block. A segment includes a minimal number of I/Os to be controlled together as a single group.

Memory macro 110 may have several segments. Data inputs are connected together across segments, and data outputs are connected together across segments, dependent on selected configuration. The type of configuration (number of partitions) is defined by signals on configuration input pins, described below. External connections (wires) are made outside the macro (for example, by the place and route tool) and correspond to a selected configuration.

In some embodiments, output drivers are provided in each segment, which can be set active (high or low voltage) or in hi-Z mode dependently on control signal. If outputs of two, four or eight segments are connected together by wires, only output buffers from selected segment drive the common node, whereas the output drivers of other, non-selected, segments are in hi-Z mode. A given one of the common output nodes is driven by the driver of a single segment at any one time; that is, two output drivers from different segments do not drive one common node (or input pin of the circuit 120) at the same time.

In some embodiments, if a given segment is not selected, a part of the memory array corresponding to this segment may optionally be placed in an inactive state to save power. Segment selection is done dynamically based on an externally provided address of data to be accessed.

Figure 2:
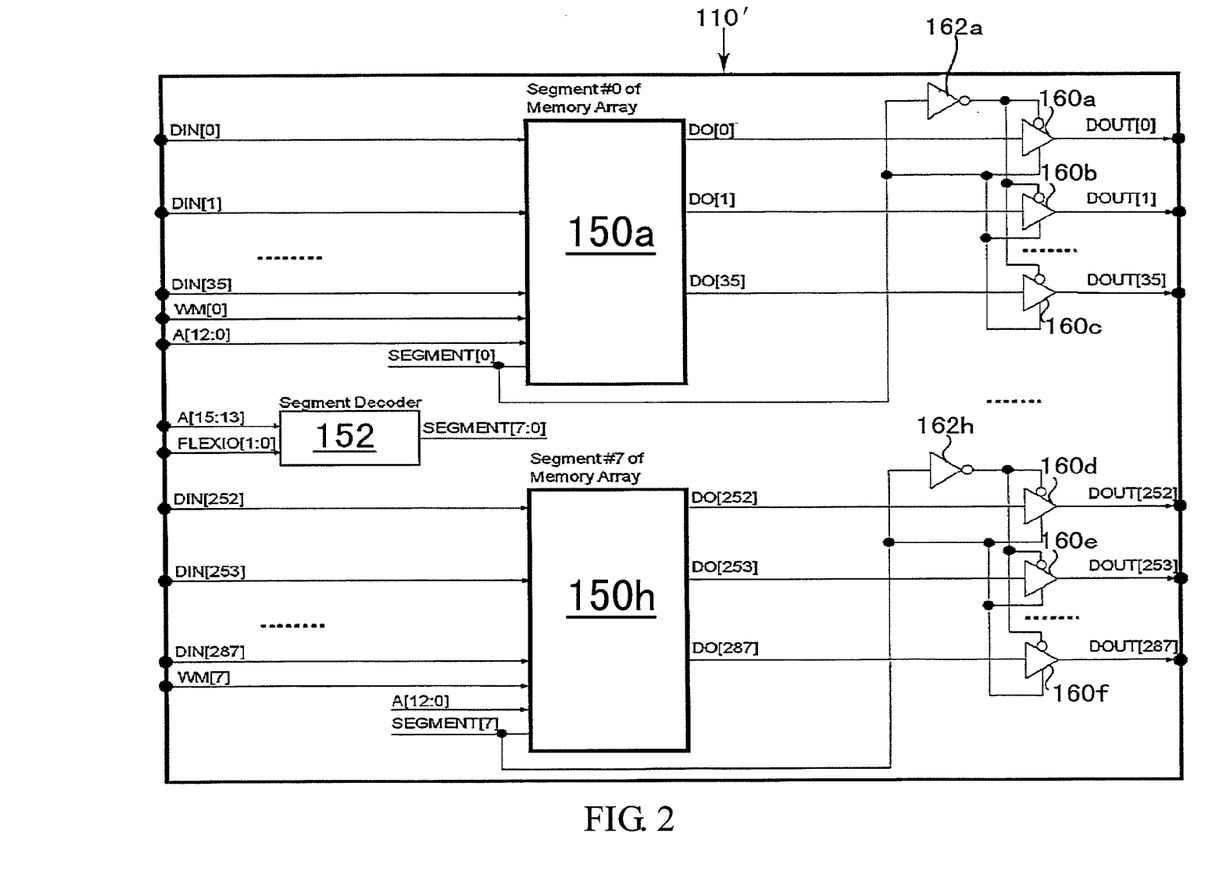
FIG. 2 is a block diagram of the eDRAM macro of FIG. 1.

FIG. 2 is a block diagram of an example of a memory macro 110' suitable for use as an eDRAM. The memory macro 110' is similar to macro 110 in FIGS. 1A and 1B, except that macro 110' is configured with 288 I/O pins (i.e., 288 data inputs and 288 data outputs). The data inputs are designated DIN(0) . . . DIN(287), and the data outputs are designated DOUT(0) . . . DOUT(287). The macro 110' is divided into eight memory segments 150a-150h, designated segment(0) . . . segment(7). Each memory array segment has a predetermined minimum number of data inputs and outputs that are to be controlled together as a group. Only two of the eight segments 150a and 150h are shown; the other six segments are configured the same way as segments 150a and 150h. Segment(0) 150a includes inputs DIN(0) . . . DIN(35) and outputs DOUT(0) . . . DOUT(35). Each successive segment includes the next 36 I/Os, until segment(7) 150h, which has inputs DIN(252) . . . DIN(287) and outputs DOUT(252) . . . DOUT(287). In the example, the total size of macro 110' is 72K (i.e., 73728 bits), corresponding to 9216 bits per segment, but other embodiments include larger or smaller macros.

Circuit 120 has at least a first input pin and at least a first output pin, wherein: respective data inputs of a plurality of memory array segments in at least one of the partitions of memory macro 110' are connected to the first output of the circuit 120 by way of a first common node, and respective outputs of the plurality of memory array segments in the at least one of the partitions are connected to the first input of the circuit by way of a second common node.

Before explaining the remaining circuitry in macro 110', reference is made to FIGS. 4 to 7H, to explain how the memory array segments 150a-150h are used in conjunction with various application specific circuits having 1, 2, 4 and 8 partitions, respectively.

Figure 4:
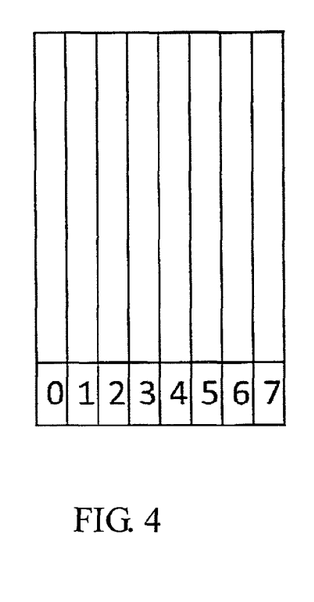
FIG. 4 show the eDRAM macro of FIG. 2 operated with a single partition.

Referring to FIG. 4, all eight segments (numbered 0 through 7) are active. The macro 110' is operated as a single large partition with a bus bandwidth of 288 bits. In a single read cycle, 36 bits are read from each of the eight segments, totaling 288 bits.

Figure 5A:
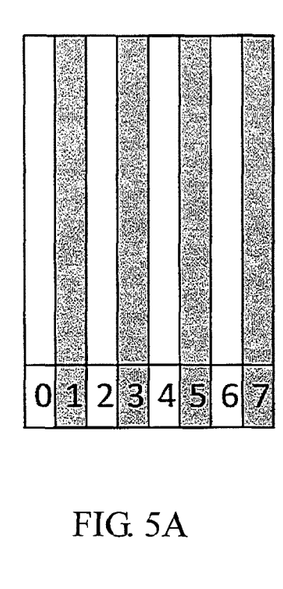
FIGS. 5A-5B show the eDRAM macro of FIG. 2 operated with two partitions.
Figure 5B:
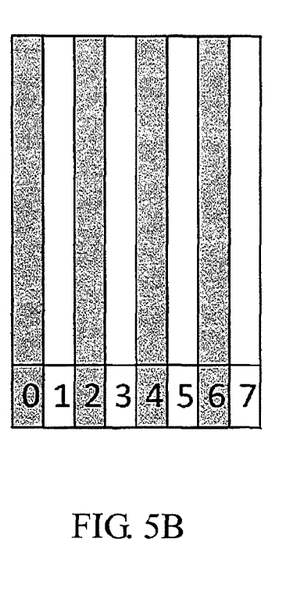
Figure 6A:
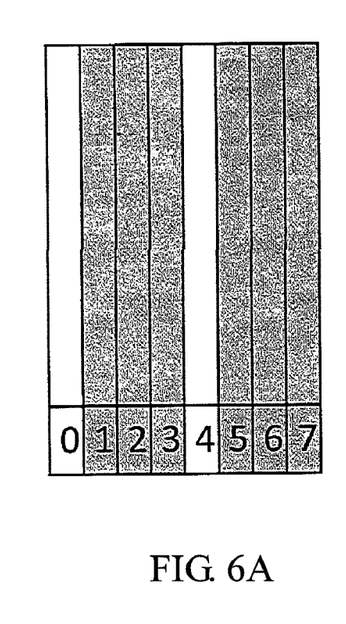
FIGS. 6A-6D show the eDRAM macro of FIG. 2 operated with four partitions.
Figure 6B:
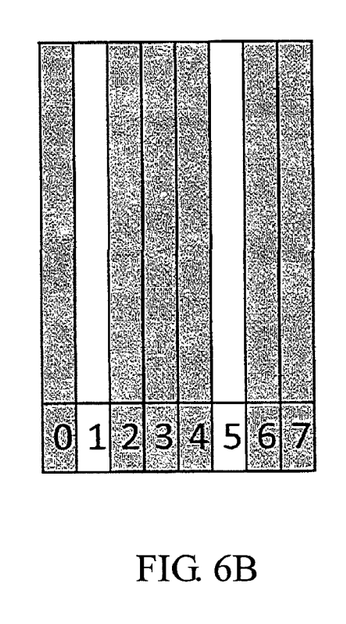
Figure 6C:
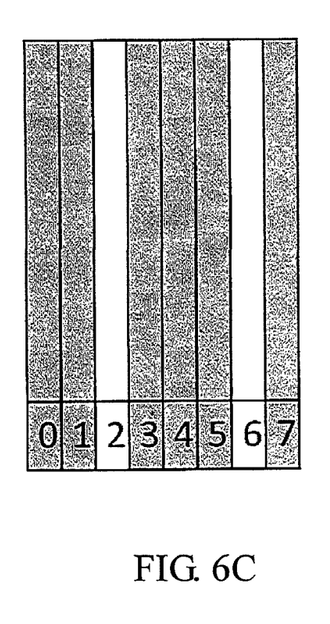
Figure 6D:
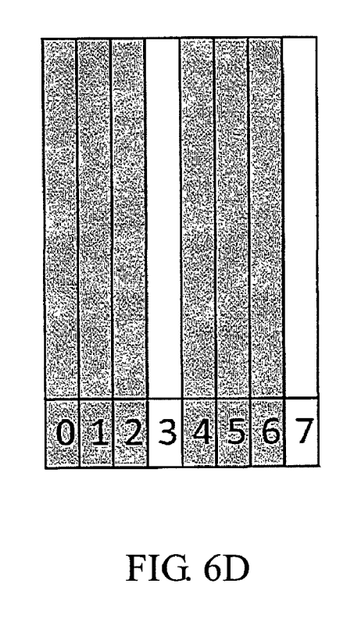
Figure 7A:
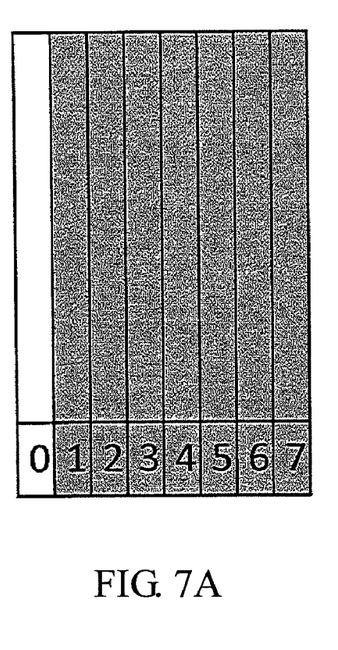
FIGS. 7A-7H show the eDRAM macro of FIG. 2 operated with eight partitions.
Figure 7B:
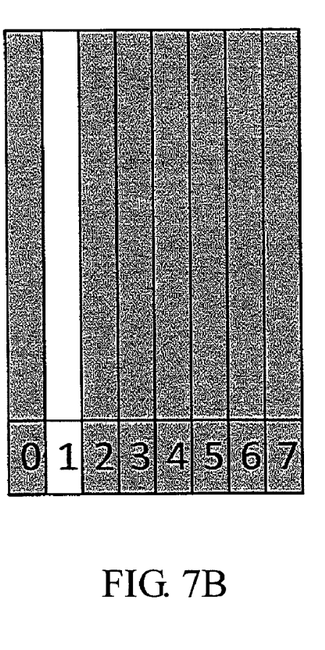
Figure 7C:
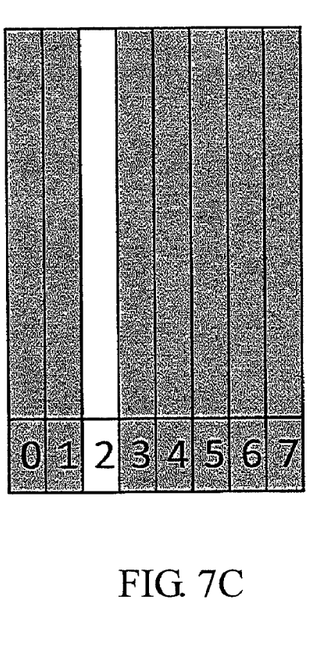
Figure 7D:
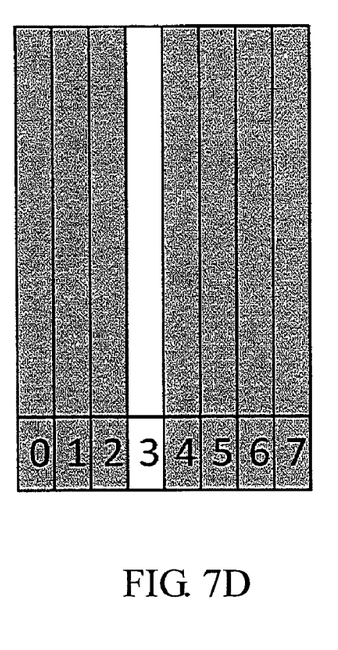
Figure 7E:
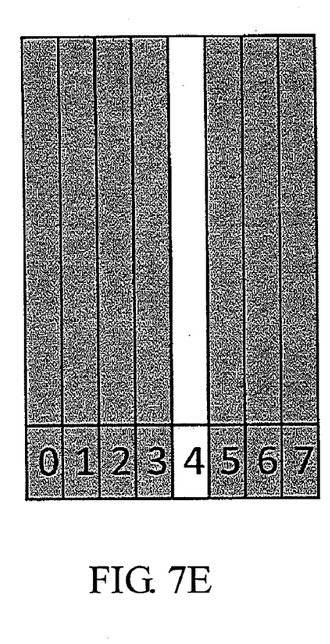
Figure 7F:
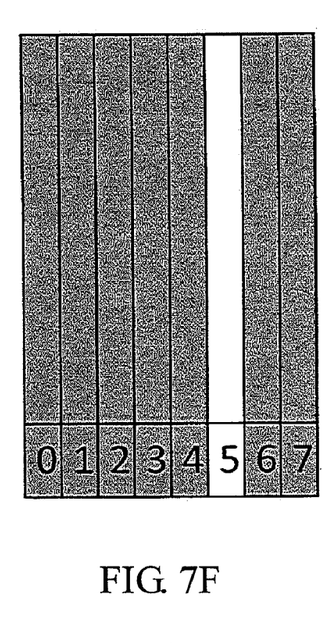
Figure 7G:
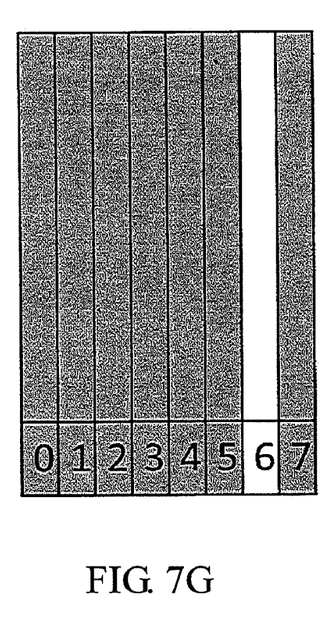
Figure 7H:
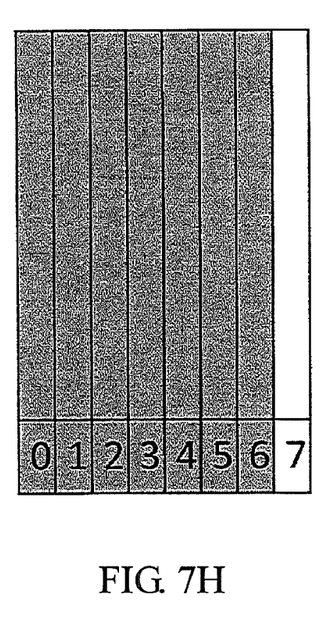

Referring to FIGS. 5A-5B, the same macro 110' is shown as it is configured for use with an application specific circuit having 144 I/O pins. In this mode, Macro 110' is operated with two partitions. Only one partition is read during a single read cycle. The same is also true for write operations. Each partition has a bandwidth of 144 bits. In a single read cycle, 36 bits are read from each of only four (out of eight) segments, totaling 144 bits. Thus, when the first partition is active (FIG. 5A), segments 0, 2, 4 and 6 are active, and segments 1, 3, 5 and 7 are inactive, as indicated by shading. Conversely, when the second partition is active (FIG. 5B), segments 0, 2, 4 and 6 are inactive, as indicated by shading, and segments 1, 3, 5 and 7 are active.

Referring to FIGS. 6A-6D, the same macro 110' is shown as it is configured for use with an application specific circuit having 72 I/O pins. In this mode, Macro 110' is operated with four partitions. Only one partition is read during a single read cycle. The same is also true for write operations. Each partition has a bandwidth of 72 bits. In a single read cycle, 36 bits are read from each of only two (out of eight) segments, totaling 72 bits. Thus, when the first partition is active (FIG. 6A), segments 0 and 4 are active, and segments 1-3 and 5-7 are inactive, as indicated by shading. When the second partition is active (FIG. 6B), segments 0, 2-4 and 6-7 are inactive, as indicated by shading, and segments 1 and 5 are active. When the third partition is active (FIG. 6C), segments 0-1, 3-5 and 7 are inactive, as indicated by shading, and segments 2 and 6 are active. When the fourth partition is active (FIG. 6D), segments 0-2 and 4-6 are inactive, as indicated by shading, and segments 3 and 7 are active.

Referring to FIGS. 7A-7H, the same macro 110' is shown as it is configured for an application specific circuit having 36 I/O pins. In this mode, Macro 110' is operated with eight partitions. Only one partition is read during a single read cycle. The same is also true for write operations. Each partition has a bandwidth of 36 bits. In a single read cycle, 36 bits are read from only one segment (out of eight), totaling 36 bits. Thus, when the first partition is active (FIG. 7A), segment 0 is active, and segments 1-7 are inactive, as indicated by shading. When the second partition is active (FIG. 7B), segments 0 and 2-7 are inactive, as indicated by shading, and segment 1 is active. When the third partition is active (FIG. 7C), segments 0-1 and 3-7 are inactive, as indicated by shading, and segment 2 is active. When the fourth partition is active (FIG. 7D), segments 0-2 and 4-7 are inactive, as indicated by shading, and segment 3 is active. When the fifth partition is active (FIG. 7E), segments 0-3 and 5-7 are inactive, as indicated by shading, and segment 4 is active. When the sixth partition is active (FIG. 7F), segments 0-4 and 6-7 are inactive, as indicated by shading, and segment 5 is active. When the seventh partition is active (FIG. 7G), segments 0-5 and 7 are inactive, as indicated by shading, and segment 6 is active. When the eighth partition is active (FIG. 7H), segments 0-6 are inactive, as indicated by shading, and segment 7 is active.

Referring again to FIG. 2, in addition to the data pins DIN[287:0] and DOUT[287:0] macro 110' also has the following control inputs: WM[7:0], A[15:0] and FLEXIO[1:0]. For any given IC, FLEXIO[1:0] is hardwired during the place and route process by connecting the two FLEXIO input pins to $V_{DD}$ or $V_{SS}$, to program in a 1 or 0 for each pin, respectively. That is, although the macro design is reusable for various numbers of partitions, the number of memory partitions for any given IC is fixed during the place and route process. DIN, DOUT, WM and A are dynamic inputs to macro 110', and the values are determined by circuit 120 during operation.

The FLEXIO[1:0] input pins receive two bits indicating the number of partitions. In the example of FIG. 2, there are four operating modes, corresponding to 1, 2, 4 or 8 partitions, respectively. The various values of the two bits of FLEXIO [1:0] correspond to these four modes. Table 1 shows the values of FLEXIO[1:0] and the corresponding number of partitions.

TABLE 1

| FLEXIO[1:0] | No. Partitions |
|---|---|
| 00 | 8 |
| 01 | 4 |
| 10 | 2 |
| 11 | 1 |

A[15:0] is the address being read or written to. Depending on the number of I/O pins being used for the number of partitions in effect, some or all of the bits of A[15:0] may be used to address a specific word. If individual 36 bit words are to be accessed, all 16 address bits are used.

WM[7:0] is the write mask that is applied. When there is a single partition, and all segments are active, as shown in FIG. 4, eight write mask bits are applied, each to a respective segment. In the example of FIG. 2, each write mask is a 36 bit mask for 36 I/O pins per segment, but in other embodiments where each segment has a different number of I/O pins, a corresponding different mask width is used.

Figure 3A:
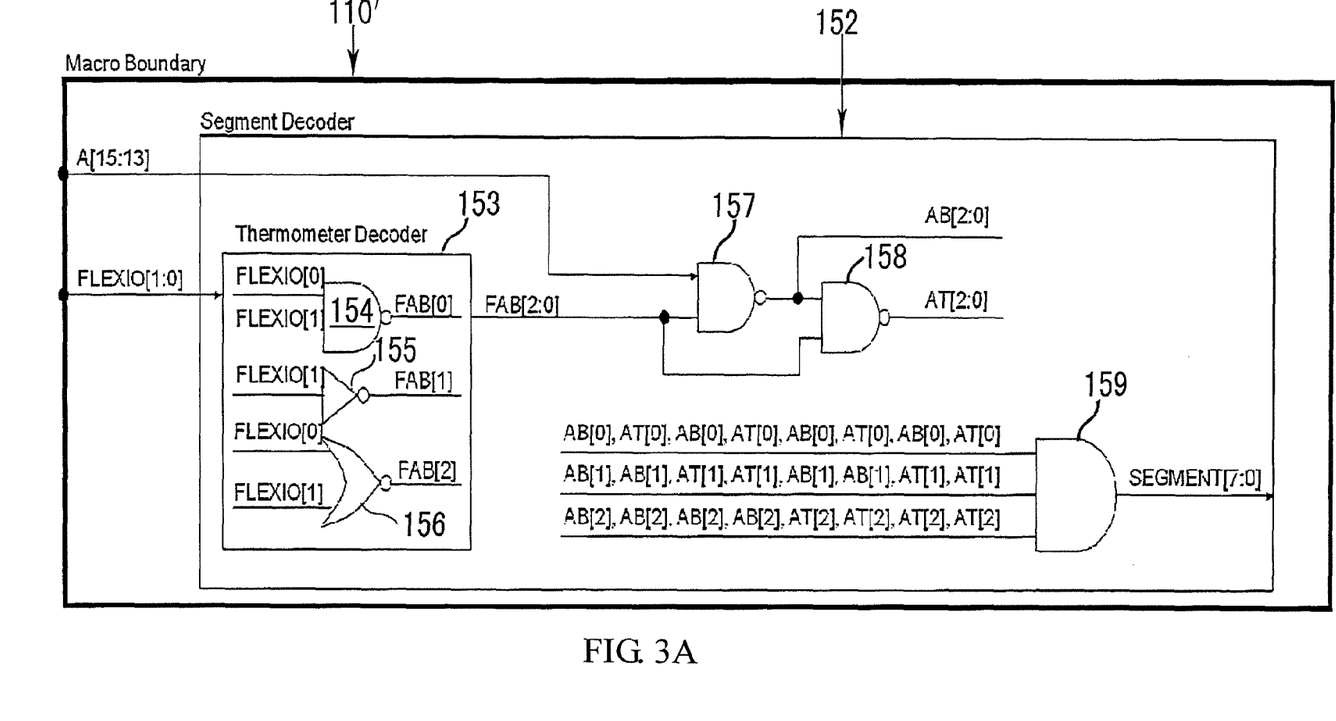
FIG. 3A is a block diagram of the segment decoder of FIG. 2.
Figure 3B:
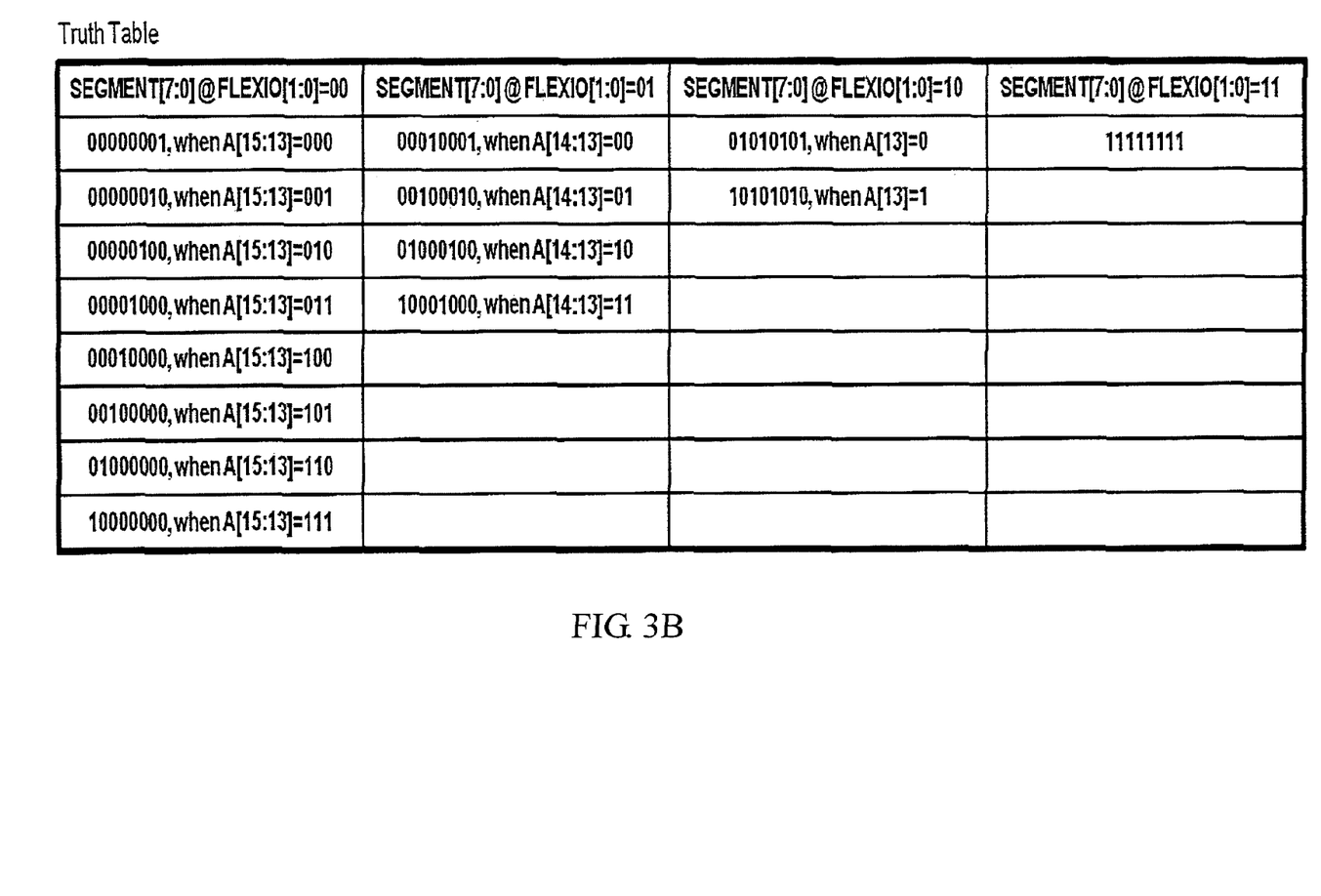
FIG. 3B is a truth table showing the values of the SEGMENT signals generated by the segment decoder circuit of FIG. 3A.

For a single partition, all 288 I/O pins are used. With a word size of 288 bits, the 2.25 Mb macro has 8K words, which can be addressed by 13 of the bits of A[15:0]. The remaining three bits are not used. For eight partitions, segment decoder 152 outputs 11111111. The segment decoder is described below with reference to FIG. 3A, and FIG. 3B is a truth table showing the values of SEGMENT[7:0].

Each segment 150a-150h of the memory macro 110' receives a respective write mask input WM[7:0], and the write mask inputs to each segment within a given one of the partitions are all connected to a common node. When there are two partitions (FIGS. 5A-5B), four write masks are used, with each write mask provided to a respective set of two of the eight segments. For two partitions, 144 I/O pins are used. With a word size of 144 bits, the 2.25 Mb macro has 16K words, which can be addressed by 14 of the bits of A[15:0]. The remaining two bits are not used. Bit A[13] is used by segment decoder 152 to provide the vector SEGMENT[7:0].

When there are four partitions (FIGS. 6A-6D), two write masks are used, with each write mask provided to a respective set of four of the eight segments. For four partitions, 72 I/O pins are used. With a word size of 72 bits, the 2.25 Mb macro has 32K words, which can be addressed by 15 of the bits of A[15:0]. The remaining bit A[15] is not used. Bits A[14:13] are used by segment decoder 152 to provide the vector SEGMENT[7:0].

When there are eight partitions (FIGS. 7A-7H), no write masks are needed, because only one segment is accessed at a time. For eight partitions, 36 I/O pins are used. With a word size of 36 bits, the 2.25 Mb macro has 64K words, which are addressed using all 16 bits of A[15:0]. Bits A[14:13] are used by segment decoder 152 to provide the vector SEGMENT[7:0].

The individual bits of SEGMENT[7:0] are provided to the eight memory array segments 150a-150h, for selectively activating one or more of the plurality of memory array segments to be accessed (and deactivating memory array segments which are not being accessed).

The individual bits of SEGMENT[7:0] are also provided to a plurality of output drivers 160a-160f coupled to the segment decoder circuit and to respective ones of the outputs The plurality of output drivers 160a-160f are configured to selectively output data from the outputs DO[287:0] of each of the activated memory array segments 150a-150h. In the example, each of the output drivers includes a respective tri-state buffer 160a-160f. The output drivers 160a-160f are configured to respond to the plurality of signals from SEGMENT[7:0], so that each output driver is coupled to one of the outputs DO[287:0] of one of the plurality of memory array segments 150a-150h that is not active (not selected) is placed in a high impedance state. The outputs from the active segments are passed on to the output pins DOUT[287:0].

In the example; each of the tri-state buffers 160a-160f is shown as a single-ended tri-state buffers.

FIGS. 3A and 3B show the segment decoder 152 of FIG. 2 in greater detail. FIG. 3A is a schematic diagram, and FIG. 3B is a truth table showing the values of SEGMENT[7:0] output by the segment decoder 152 of FIG. 3A. Segment decoder 152 receives as inputs three of the 16 input address bits, A[15:13], and FLEXIO[1:0], and outputs SEGMENT[7:0]. The segment decoder 152 generates the plurality of signals SEGMENT[7:0] based on the portion of the address, and the FLEXIO[1:0] inputs. The segment decoder 152 is configured to generate the plurality of signals SEGMENT[7:0], so that a number of memory array segments activated at a given time is equal to a total number of memory array segments divided by the number of memory partitions.

FLEXIO[1:0] is input to the "thermometer decoder" 153, which outputs a three-bit vector FAB[2:0]. Within thermometer decoder 153, a NAND gate 154 outputs the NAND of FLEXIO(0) and FLEXIO(1) as FAB(0); inverter 155 outputs the inverse of FLEXIO(1) as FAB(1); and NOR gate 156 outputs the NOR of FLEXIO(0) and FLEXIO(1) as FAB(2). FAB[2:0] AND A[15:13] are input to NAND gate 157. FAB [2:0] and the output of NAND gate 157 are input to NAND gate 158. The individual bits of the outputs of NAND gates 157 and 158 are input to three-way AND gate 159 in eight combinations, as shown in FIG. 3A. The outputs of AND gate 159 provide SEGMENT[7:0].

FIG. 3B is a truth table, showing the values for SEGMENT [7:0] output by segment decoder for each combination of FLEXIO[1:0] and A[15:13]. In FIG. 3B, eight possible combinations of inputs to three-way AND gate 159 are arranged in eight columns, corresponding to the eight respective output values of SEGMENT[7:0].

Figure 8A:
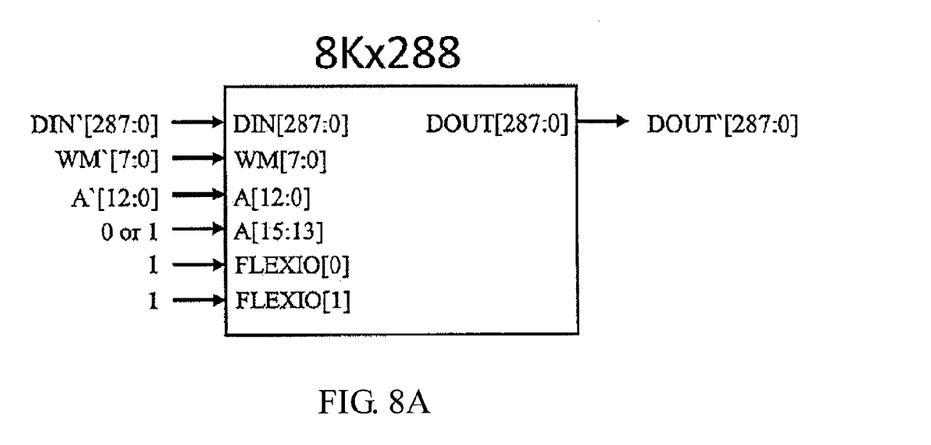
FIGS. 8A-8D show the I/O configuration of the macro of FIG. 2, when operated with 1, 2, 4 and 8 partitions, respectively.
Figure 8B:
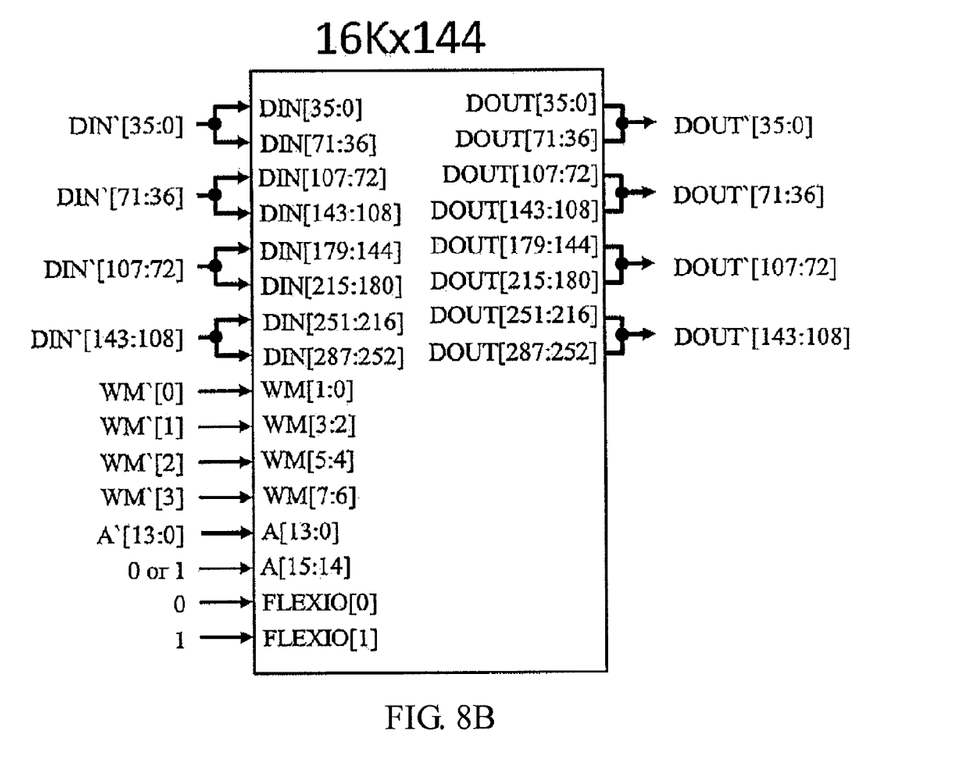
Figure 8C:
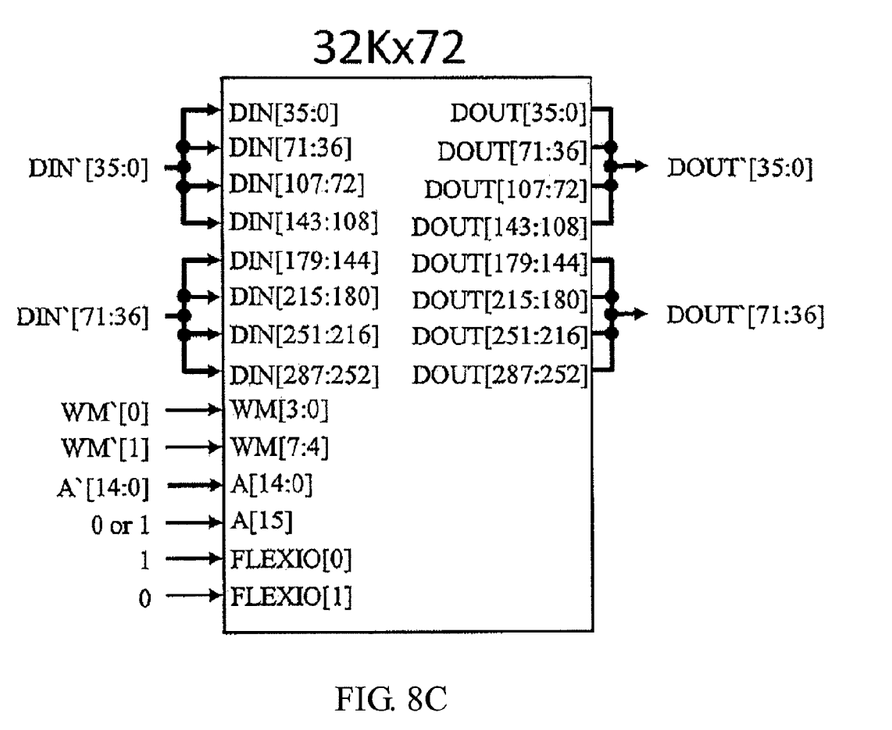
Figure 8D:
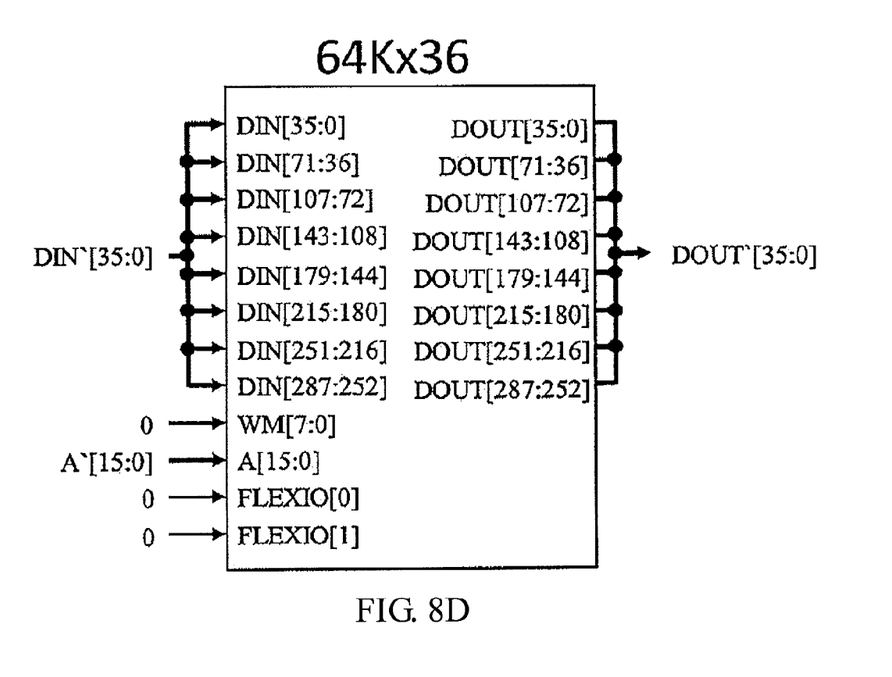

FIGS. 8A-8D are diagrams showing the inputs and the external connections for the macro 110' of FIG. 2, for each of the four modes discussed above. FIG. 8B-8D shows multiple partition configurations, in which corresponding I/O pins from plural segments in the same partition are connected together (by hardwired connections during the place and route step). That is, within each partition, inputs DIN' from the output pins of circuit 120 are striped across plural segments 150a-150h.

FIG. 8A shows the macro 110' configured to use all of its I/O pins with a single partition. In this mode, 'macro 110' has 8192 words of 288 bits per word. Each of the 288 input pins DIN[287:0] of macro 110' is connected individually to a respective output pin of application specific circuit 120. Each of the 288 output pins DOUT[287:0] is connected individually to a respective input pin of application specific circuit 120. Each write mask input WM[7:0] is connected individually to receive a respective write mask WM'[7:0] from circuit 120. The 13 least significant bits (LSBs) A'[12:0] of the address are connected to the 13 LSB pins A[12:0] of macro 110'. The remaining address pins A[15:13] are not used when there is only a single partition, and can be connected to either 1 or 0 ($V_{DD}$ or $V_{SS}$). The FLEXIO[1:0] pins are both connected to 1 ($V_{DD}$).

FIG. 8B shows the macro 110' configured to use 144 I/O pins with two partitions. In this mode, 'macro 110' has 16K words of 144 bits per word. The 288 input pins DIN[287:0] of macro 110' are connected to 144 pairs of pins DIN'[143:0]. For example DIN(0) and DIN(36) are both connected to DIN'(0) by way of a first common node; DIN(1) and DIN(37) are both connected to DIN'(1) by way of a second common node; DIN(2) and DIN(38) are both connected to DIN'(2) by way of a second common node, etc. Similarly, on the output side, DOUT(0) and DOUT(36) are both connected to DOUT'(0) by way of a first common node; DOUT(1) and DOUT(37) are both connected to DOUT'(1) by way of a second common node, etc. The inputs DIN'[144:0] are connected to the 144 output pins of circuit 120, and the outputs DOUT'[144:0] are connected to the 144 input pins of circuit 120. In general, with two partitions and 2×N segments, the I/Os from segments 0 and 1 are connected together, the I/Os from segments 2 and 3 are connected together, etc., until I/Os from segments 2×N−2 and 2×N−1 are connected together.

In a similar fashion, each write mask WM'[3:0] from circuit 120 is provided to two of the eight write mask input pins WM[7:0] of macro 110'. The 14 least significant bits (LSBs) A'[13:0] of the address are connected to the 14 LSB pins A[13:0] of macro 110'. The remaining address pins A[15:14] are not used when there is only two partitions, and can be connected to either 1 or 0 ($V_{DD}$ or $V_{SS}$). FLEXIO(0) is connected to 0 ($V_{SS}$). FLEXIO(1) is connected to 1 ($V_{DD}$).

FIG. 8C shows the macro 110' configured to use 72 I/O pins with four partitions. In this mode, 'macro 110' has 32K words of 72 bits per word. The 288 input pins DIN[287:0] of macro 110' are connected to 72 sets of pins DIN'[71:0]. For example DIN(0), DIN(36), DIN(72) and DIN(108) are all connected to DIN'(0) by way of a first common node; DIN(1), DIN(37), DIN(73 and DIN(109) are all connected to DIN'(1) by way of a second common node, etc. The outputs DIN[287:0] are similarly grouped in sets of four pins, with each set connected to one of the nodes DOUT'[71:0]. The inputs DIN'[72:0] are connected to the 72 output pins of circuit 120, and the outputs DOUT'[72:0] are connected to the 72 input pins of circuit 120. Each write mask WM'[1:0] from circuit 120 is provided to four of the eight write mask input pins WM[7:0] of macro 110'. The 15 least significant bits (LSBs) A'[14:0] of the address are connected to the 15 LSB pins A[14:0] of macro 110'. The remaining address pin A(15) is not used when there are four partitions, and can be connected to either 1 or 0 ($V_{DD}$ or $V_{SS}$). FLEXIO(0) is connected to 1 ($V_{DD}$). FLEXIO(1) is connected to 0 ($V_{DD}$). In general, with four partitions and 4×N segments, the I/Os from segments 0-3 are connected together, the I/Os from segments 4-7 are connected together, etc., until I/Os from segments 4×N−4 to 4×N−1 are connected together.

FIG. 8D shows the macro 110' configured to use 36 I/O pins with eight partitions.

In this mode, 'macro 110' has 64K words of 36 bits per word. The 288 input pins DIN[287:0] of macro 110' are connected to 36 sets of pins DIN'[35:0]. For example DIN(0), DIN(36), DIN(72), DIN(108), DIN(144), DIN(180), DIN(216) and DIN(252) are all connected to DIN'(0) by way of a first common node, etc. The outputs DIN[287:0] are similarly grouped in sets of eight pins, with each set connected to one of the nodes DOUT'[35:0]. The inputs DIN'[35:0] are connected to the 36 output pins of circuit 120, and the outputs DOUT'[35:0] are connected to the 36 input pins of circuit 120. The write masks WM[7:0] are not needed in this mode, because at any given time, only one segment is active. All 16 bits A'[15:0] of the address are connected to the 16 pins A[15:0] of macro 110'. FLEXIO(0) and FLEXIO(1) are both connected to 0 ($V_{SS}$). In general, with eight partitions and 8×N segments, the I/Os from segments 0-7 are connected together, etc., until I/Os from segments 8×N−8 to 8×N−1 are connected together.

To configure the macro 110' for a desired I/O bus bandwidth, the designer applies the following procedure:

The IC designer chooses a configuration corresponding to the I/O bus bandwidth (number of I/O pins) of the circuit 120. Table 1 provides the values of FLEXIO[1:0] corresponding to the selected bus bandwidth. The IC designer sets the FLEXIO[1:0] values to 0 or 1 by connecting the FLEXIO[1:0] pins to $V_{SS}$ or $V_{DD}$ in the netlist. Similarly any unused write mask inputs and unused address bits can be connected to $V_{DD}$ or to $V_{SS}$ in the netlist. (Write masks are unused when the maximum number of partitions is used, and only a single segment is active at any one time. One or more bits of the address are not used when fewer than the maximum number of partitions are used). The input pins DIN of macro 110' are connected to first common nodes, which are connected to the output pins of circuit 120 in the netlist. The output pins DOUT of macro 110' are connected to second common nodes, which are connected to the input pins DIN' of circuit 120 in the netlist.

Figure 9:
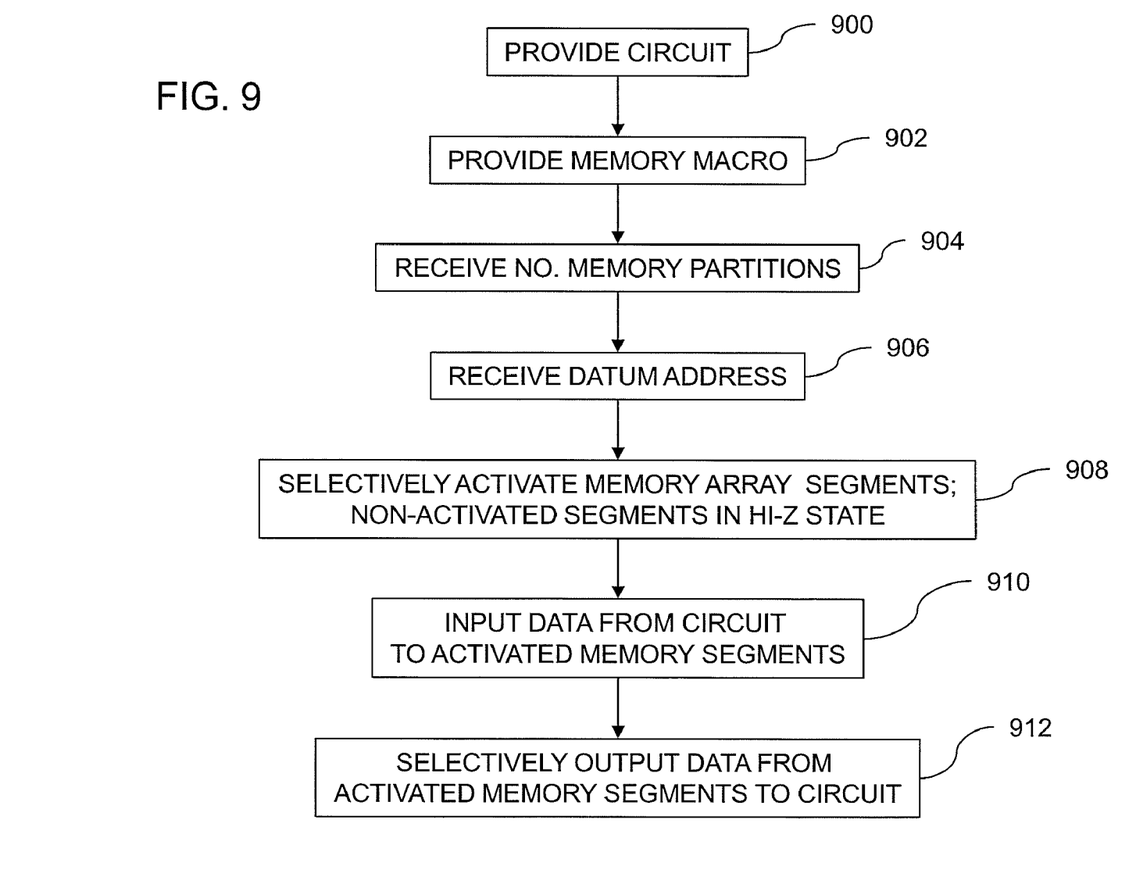
FIG. 9 is a flow chart of a method of using the memory macro of FIG. 2

FIG. 9 is a flow chart of a method of using the memory macro of FIG. 2.

At step 900, a circuit is provided, having a number N/K (I/Os), where K is an integer. Each output of the circuit is connected to a respective first common node. Each input of the circuit is connected to a respective second common node.

At step 902, a memory macro is provided, having a plurality of memory array segments, each having a predetermined number of data inputs and outputs. The memory macro has N inputs and outputs (I/Os), where N is an integer.

At step 904, a first value is received, indicating a number of memory partitions among which a plurality of memory array segments in a memory macro are to be divided.

At step 906, an address of a datum to be accessed in the memory macro is received.

At step 908, one or more of the plurality of memory array segments to be accessed are selectively activated based on the first value. The selectively activating step uses a portion of the address received in step 906. Each output of the memory macro has a tri-state output buffer, and the output buffers of remaining ones of the plurality of memory array segments which are not selectively activated are placed in a high impedance state.

At step 910, signals are provided from one of the first common nodes to N/K of the data inputs of the memory macro.

At step 912, data are selectively output from the respective outputs of each of the respective activated memory array segments.

Using reconfigurable I/Os allows reduced power consumption by setting segments to an inactive state while they are not being accessed, and provides additional flexibility to generate memories with different numbers of I/Os using a single macro design. Changing the macro configuration does not affect output delay, which is advantageous for a high-speed design.

Thus, an example is described in which an eDRAM architecture allows the IC designer to effectively change the number of I/Os in the same reusable eDRAM macro by external connections. The same macro can provide different number of I/Os. Configuration is done by external connections with standard automatic place and route (APR) tools. There is no need to add multiplexers inside the memory macro, or otherwise change the macro design to change the effective number of I/O pins that are seen by the IP designer's circuit 120.

Although an example is presented above in which macro 110' has eight memory array segments, each with 36 I/Os, any number of segments and any number of I/Os per segment can be used. Although options of one, two, four and eight partitions are presented in the example, other numbers of partitions can be used.

Although an example of a method is provided in which I/Os from the various segments are connected together in the place and route tool, in another embodiment of the method, the designer of circuit 120 can incorporate the common nodes 131a, 131b, 141a, 141b and connections into the design of circuit 120, in which case the place and route tool makes a separate connection to each I/O pin of the macro 110', even in the partitioned modes of FIGS. 8B-8D. The FLEXIO[1:0] inputs and WM[7:0] inputs would still be set the same way as described above with reference to FIGS. 8B-8D. The change from the description above is that the connecting lines and common nodes would be moved into circuit 120, and the number of output pins in circuit 120 would change. The macro 110' still operates in a partitioned mode, with a subset of the segments active at any one time.

In some embodiments, a memory macro comprises a plurality of memory array segments, each having a predetermined number of data inputs and outputs. A segment decoder circuit is configured to: receive a first value indicating a number of memory partitions among which the memory array segments are to be divided, and output a plurality of signals for selectively activating one or more of the plurality of memory array segments to be accessed based on the first value. A plurality of output drivers are coupled to the segment decoder circuit and to respective ones of the outputs. The plurality of output drivers are configured to selectively output data from the respective outputs of each of the respective activated memory array segments.

In some embodiments, an integrated circuit comprises an embedded memory macro and a circuit. The memory macro comprises a plurality of memory array segments, each having a predetermined number of data inputs and outputs. A segment decoder circuit is configured to: receive a first value indicating a number of memory partitions among which the memory array segments are to be divided, and output a plurality of signals for selectively activating one or more of the plurality of memory array segments to be accessed based on the first value. A plurality of output drivers are coupled to the segment decoder circuit and to respective ones of the outputs. The plurality of output drivers are configured to selectively output data from the respective outputs of each of the respective activated memory array segments. The circuit is configured for performing at least one arithmetic or logical operation on data to be retrieved from or stored in the embedded memory. The circuit has at least a first input and at least a first output, wherein: respective data inputs of a plurality of memory array segments in at least one of the partitions are connected to the first output of the circuit by way of a first common node, and respective outputs of the plurality of memory array segments in the at least one of the partitions are connected to the first input of the circuit by way of a second common node.

In some embodiments, a method comprises providing a memory macro having a plurality of memory array segments, each having a predetermined number of data inputs and outputs; receiving a first value indicating a number of memory partitions among which a plurality of memory array segments in a memory macro are to be divided, and selectively activating one or more of the plurality of memory array segments to be accessed based on the first value; and selectively outputting data from the respective outputs of each of the respective activated memory array segments.

Although the subject matter has been described in terms of exemplary embodiments, it is not limited thereto. Rather, the appended claims should be construed broadly, to include other variants and embodiments, which may be made by those skilled in the art.

What is claimed is:

1. A memory macro, comprising:
    a plurality of memory array segments, each having a predetermined number of data inputs and outputs;
    a segment decoder circuit configured to:
        receive a first value indicating a number of memory partitions among which the memory array segments are to be divided, and
        output a plurality of signals for selectively activating one or more of the plurality of memory array segments to be accessed based on the first value; and
    a plurality of output drivers coupled to the segment decoder circuit and to respective ones of the outputs, the plurality of output drivers configured to selectively output data from the respective outputs of each of the respective activated memory array segments.

2. The memory macro of claim 1, wherein the plurality of memory array segments are configured so that ones of the memory array segments which are not selected by the plurality of signals are placed in an inactive state.

3. The memory macro of claim 1, wherein each of the output drivers includes a tri-state buffer.

4. The memory macro of claim 3, wherein the output drivers are configured to respond to the plurality of signals, so that each output driver coupled to one of the outputs of one of the plurality of memory array segments that is not selected is placed in a high impedance state.

5. The memory macro of claim 1, wherein the memory macro is an embedded dynamic random access memory macro.

6. The memory macro of claim 1, wherein the segment decoder is configured to generate the plurality of signals so that a number of memory array segments activated at a given time is equal to a total number of memory array segments divided by the number of memory partitions.

7. The memory macro of claim 1, wherein the data inputs to two or more segments within a given one of the partitions are connected to a common node.

8. The memory macro of claim 1, wherein the outputs from two or more segments within a given one of the partitions are connected to a common node.

9. The memory macro of claim 1, wherein each segment of the memory macro receives a respective write mask input, and the write mask inputs to each segment within a given one of the partitions are all connected to a common node.

10. The memory macro of claim 1, wherein the segment decoder circuit is further configured to receive a portion of an address in the memory macro to be accessed, and the plurality of signals are also based on the portion of the address.

11. An integrated circuit, comprising:
an embedded memory macro comprising:
a plurality of memory array segments, each having a predetermined number of data inputs and outputs;
a segment decoder circuit configured to:
receive a first value indicating a number of memory partitions among which the memory array segments are to be divided, and output a plurality of signals for selectively activating one or more of the plurality of memory array segments to be accessed based on the first value; and
a plurality of output drivers coupled to the segment decoder circuit and to respective ones of the outputs, the plurality of output drivers configured to selectively output data from the respective outputs of each of the respective activated memory array segments;
a circuit configured for performing at least one arithmetic or logical operation on data to be retrieved from or stored in the embedded memory, the circuit having at least a first input and at least a first output, wherein:
respective data inputs of a plurality of memory array segments in at least one of the partitions are connected to the first output of the circuit by way of a first common node, and
respective outputs of the plurality of memory array segments in the at least one of the partitions are connected to the first input of the circuit by way of a second common node.

12. The integrated circuit of claim 11, wherein:
the memory macro has I memory array segments, each memory array segment having J inputs and J outputs,
the circuit has K inputs and K outputs, where, and $[(I*J)/K]$ is an integer, and
each of the K outputs of the circuit is connected to a respective first common node that is also connected to $[(I*J)/K]$ inputs of the memory macro in $[(I*J)/K]$ respectively different memory array segments.

13. The integrated circuit of claim 12, wherein $[(I*J)/K]$ is the number of partitions.

14. A method, comprising:
providing a memory macro having a plurality of memory array segments, each having a predetermined number of data inputs and outputs;
receiving a first value indicating a number of memory partitions among which a plurality of memory array segments in a memory macro are to be divided, and
selectively activating one or more of the plurality of memory array segments to be accessed based on the first value; and
selectively outputting data from the respective outputs of each of the respective activated memory array segments.

15. The method of claim 14, further comprising:
receiving an address of a datum to be accessed in the memory macro, wherein the selectively activating step uses a portion of the received address.

16. The method of claim 14, wherein the memory macro has N inputs and outputs (I/Os), where N is an integer, the method further comprising:
providing a circuit having a number N/K (I/Os), where K is an integer, each output of the circuit connected to a respective first common node, each input of the circuit connected to a respective second common node;
providing signals from one of the first common nodes to N/K of the data inputs of the memory macro; and
providing signals from N/K of the outputs of the memory macro to one of the second common nodes.

17. The method of claim 16, wherein the signals from the one of the first common nodes are provided to inputs in N/K respectively different segments in the memory macro.

18. The method of claim 16, wherein the memory macro has K write mask inputs, the method further comprising providing signals from a third common node to K of the write mask inputs of the memory macro.

19. The method of claim 14, wherein the step of receiving the first value comprises receiving a plurality of voltage signals from a plurality of circuit traces, each circuit trace individually coupled to $V_{SS}$ or $V_{DD}$.

20. The method of claim 14, wherein each output of the memory macro has a tri-state output buffer, and the output buffers of remaining ones of the plurality of memory array segments which are not selectively activated are placed in a high impedance state.

* * * * *